United States Patent

Nishii et al.

(10) Patent No.: US 9,508,870 B2
(45) Date of Patent: Nov. 29, 2016

(54) DIODE

(75) Inventors: Akito Nishii, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/372,622

(22) PCT Filed: Apr. 13, 2012

(86) PCT No.: PCT/JP2012/060152
§ 371 (c)(1),
(2), (4) Date: Jul. 16, 2014

(87) PCT Pub. No.: WO2013/153668
PCT Pub. Date: Oct. 17, 2013

(65) Prior Publication Data
US 2015/0021747 A1      Jan. 22, 2015

(51) Int. Cl.
H01L 29/861    (2006.01)
H01L 29/868    (2006.01)
H01L 29/06     (2006.01)
H01L 29/36     (2006.01)

(52) U.S. Cl.
CPC .......... *H01L 29/861* (2013.01); *H01L 29/063* (2013.01); *H01L 29/36* (2013.01); *H01L 29/868* (2013.01)

(58) Field of Classification Search
CPC ... H01L 29/861; H01L 29/36; H01L 29/063; H01L 29/868; H01L 29/8611; H01L 29/417
See application file for complete search history.

(56) References Cited

U.S. PATENT DOCUMENTS

| 5,859,446 A * | 1/1999 | Nagasu ............... H01L 29/8611 257/104 |
| 5,969,400 A | 10/1999 | Shinohe et al. |
| 6,175,143 B1 | 1/2001 | Fujihira et al. |
| 6,870,199 B1 * | 3/2005 | Yoshikawa ........... H01L 21/263 257/131 |
| 9,385,183 B2 * | 7/2016 | Chen ................... H01L 29/7395 |

(Continued)

FOREIGN PATENT DOCUMENTS

| JP | H09-232597 A | 9/1997 |
| JP | H10-335679 A | 12/1998 |

(Continued)

OTHER PUBLICATIONS

Machine translation, Kameyama, Japanese Pat. Pub. No. JP 2009-38213, translation date: Aug. 24, 2015, Espacenet, all pages.*

(Continued)

*Primary Examiner* — Victoria K Hall
(74) *Attorney, Agent, or Firm* — Studebaker & Brackett PC

(57) ABSTRACT

A p-type anode layer (2) provided on an n-type drift layer (1) in the active region. A p-type diffusion layer (3) is provided on the n-type drift layer (1) in a termination region outside the active region. An oxide film (4) covers an outer periphery of the p-type anode layer (2). An anode electrode (5) is connected to a portion of the p-type anode layer (2) not covered with the oxide film (4). An $n^+$-type cathode layer (7) is provided below the n-type drift layer (1). A cathode electrode (8) is connected to the $n^+$-type cathode layer (7). An area of a portion of the p-type anode layer (2) covered with the oxide film (4) is 5 to 30% of a total area of the p-type anode layer (2).

6 Claims, 12 Drawing Sheets

(56) References Cited

U.S. PATENT DOCUMENTS

| | | | |
|---|---|---|---|
| 2001/0015445 A1* | 8/2001 | Nemoto | H01L 29/8611 257/138 |
| 2009/0289276 A1 | 11/2009 | Yoshiura et al. | |
| 2010/0022064 A1* | 1/2010 | Hall | H01L 27/0288 438/382 |
| 2010/0096664 A1* | 4/2010 | Tsukuda | H01L 29/0649 257/139 |
| 2011/0176244 A1* | 7/2011 | Gendron | H01L 27/0259 361/56 |
| 2011/0233714 A1 | 9/2011 | Lu | |
| 2011/0291223 A1* | 12/2011 | Nakamura | H01L 23/3171 257/493 |

FOREIGN PATENT DOCUMENTS

| | | | | |
|---|---|---|---|---|
| JP | 2001-135831 | A | | 5/2001 |
| JP | 2002-203955 | A | | 7/2002 |
| JP | 2003-224282 | A | | 8/2003 |
| JP | 2008-263217 | A | | 10/2008 |
| JP | 2009-38213 | | * | 2/2009 ........... H01L 29/861 |
| JP | 2009-038213 | A | | 2/2009 |
| JP | 2009-283781 | A | | 12/2009 |
| JP | 2010-098189 | A | | 4/2010 |
| JP | 2011-204710 | A | | 10/2011 |
| JP | 2012-009811 | A | | 1/2012 |

OTHER PUBLICATIONS

Machine translation, Yoshikawa, Japanese Pat. Pub. No. JP 2008-263217, translation date: Aug. 24, 2015, Espacenet, all pages.*
International Search Report; PCT/JP2012/060152; Jul. 17, 2012.
Akito Nishii et al., "Relaxation of Current Filament due to RFC Technology and Ballast Resistor for Robust FWD Operation", Proceedings of the 23rd ISPSD (2011).
An Office Action; "Notice of Reasons for Rejection," issued by the Japanese Patent Office on Dec. 16, 2014, which corresponds to Japanese Patent Application No. 2014-510000 and is related to U.S. Appl. No. 14/372,622; with English language partial translation.
Notification of Transmittal of Translation of the International Preliminary Report on Patentability and Translation of Written Opinion of the International Searching Authority; PCT/JP2012/060152; issued on Oct. 23, 2014.
An Office Action issued by the Korean Patent Office on Nov. 22, 2015, which corresponds to Korean Patent Application No. 10-2014-7028149 and is related to U.S. Appl. No. 14/372,622; with English language partial translation.

* cited by examiner

DIODE

TECHNICAL FIELD

The present invention relates to a diode which is one of devices making up a power module having a high withstand voltage of 600 V or higher, and more particularly, to a diode capable of improving breakdown voltage.

BACKGROUND ART

Recovery operation of a diode is an operation in which the diode transitions from an ON (current-carrying) state to an OFF (current-shutdown) state in accordance with a switching operation of switching elements that form a pair. In such a case, as a potential difference between an anode and a cathode increases, a depletion layer centered on a PN junction spreads inside the device.

In an ON state, a large quantity of carriers (on the order of 100 to 10,000 times an impurity concentration of a substrate) is flowing through the device. Due to an electric field in the depletion layer during the recovery operation, positive holes are attracted to the anode side and electrons are attracted to the cathode side, and these are finally exited from the anode electrode and cathode electrode respectively.

Since no voltage is applied to the diode in the ON state, almost no energy loss occurs even when a high current flows (actually, a voltage corresponding to a current=on the order of several V is applied, which constitutes an ON loss of the diode). On the other hand, during the recovery operation, a current flows with a high voltage applied, a large energy loss and heat are generated. Therefore, the higher the current in the ON state, the more carriers exist inside the device, and a high current flows during the recovery operation, and heat produced thereby may cause a thermal destruction.

There are indices indicating recovery characteristics of a diode such as recovery operation loss, and reverse recovery current. It has been an object of diode development so far to improve these indices. These indices are set to reduce diode losses at the time of normal switching, and improving these indices can also result in improvement of overload tolerance of thermal destruction. If the breakdown voltage is improved, breakdown will not take place even when a current density increases, and it is thereby possible to reduce the chip size and cost.

Moreover, the depletion layer spreads not only in a longitudinal direction of the device between the anode and cathode but also in a plane direction. When the depletion layer which has spread in the plane direction reaches a chip end, the withstand voltage may become unstable and discharge may occur. In order to prevent the depletion layer from reaching the chip end, a termination region (inactive region) is provided which includes neither anode layer nor anode electrode and does not perform device operation, in addition to an active region which includes an anode layer and performs device operation (e.g., see Patent Literature 1).

CITATION LIST

Patent Literature

Patent Literature 1: Japanese Patent Laid-Open No. 10-335679

SUMMARY OF INVENTION

Technical Problem

Since the termination region basically does not perform device operation, the termination region has no direct effect on recovery characteristics of a diode. However, in an ON state, carriers are injected from the cathode side into the termination region, and carriers are further diffused from the active region, and therefore many carriers are accumulated in the termination region. During the recovery operation, carriers in the termination region, and positive holes in particular are concentrated at the contact end (peripheral edge of the junction between the anode electrode and anode layer), provoking a local temperature rise.

Furthermore, carriers are likely to concentrate at the contact end of the anode electrode and an electric field is also likely to concentrate. Moreover, if the anode layer directly below the contact end is a shallow and thin diffusion layer, a depletion layer is likely to spread, which causes the electric field to further concentrate, producing an avalanche phenomenon. Carriers are thereby generated and a current concentrates.

Moreover, in a device having a finite width, the end of the anode layer has a curvature. When the depletion layer extends from the main junction during a recovery operation, the electric field concentrates at the end of the anode layer having a curvature, and therefore an avalanche phenomenon occurs at the location and the current concentrates.

For this reason, the boundary between the active region and the inactive region is more likely to be destroyed during the recovery operation, and even if characteristics of the active region are improved, the breakdown voltage cannot be improved.

The present invention has been made to solve the above-described problems, and an object thereof is to provide a diode which can improve the breakdown voltage.

Means for Solving the Problems

A diode according to the present invention includes an n-type drift layer; a p-type anode layer on the n-type drift layer in the active region; a p-type diffusion layer on the n-type drift layer in a termination region outside the active region; a first insulating film covering an outer periphery of the p-type anode layer; an anode electrode connected to a portion of the p-type anode layer not covered with first insulating film; an n-type cathode layer below the n-type drift layer; and a cathode electrode connected to the n-type cathode layer, wherein an area of a portion of the p-type anode layer covered with the first insulating film is 5 to 30% of a total area of the p-type anode layer.

Advantageous Effects of Invention

The present invention makes it possible to improve the breakdown voltage.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
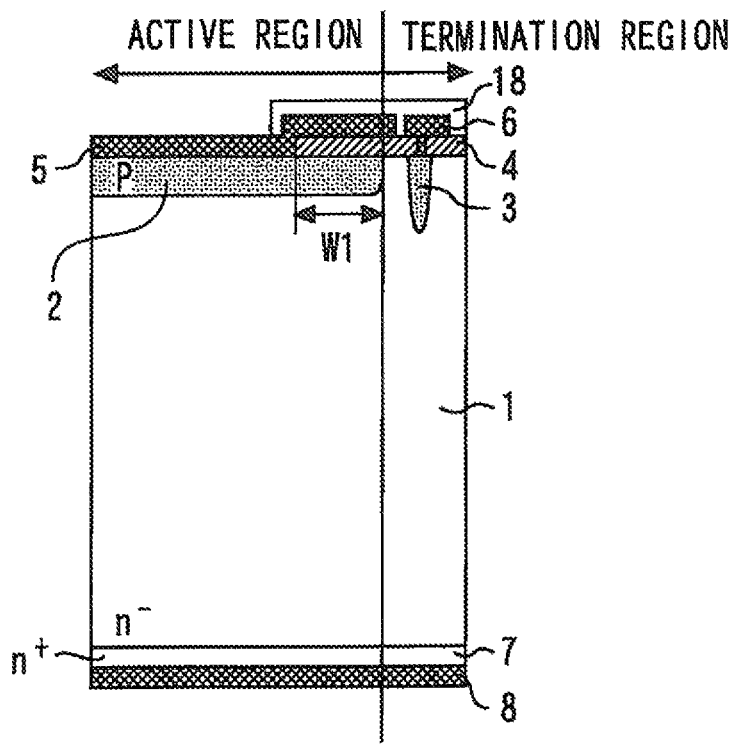
FIG. 1 is a cross-sectional view illustrating a diode according to Embodiment 1 of the present invention.

FIG. 1 is a cross-sectional view illustrating a diode according to Embodiment 1 of the present invention. An active region is provided in the chip center and a termination region is provided outside the active region mainly intended to maintain a withstand voltage. In the active region, a p-type anode layer 2 is provided on an $n^-$-type drift layer 1. A p-type diffusion layer 3 is provided on the $n^-$-type drift layer 1 in the termination region. The p-type anode layer 2 and the p-type diffusion layer 3 are formed by injecting accepter impurity on the surface side of a Si substrate having a desired thickness and specific resistance.

The outer periphery of the p-type anode layer 2, that is, a region between the peripheral edge of the p-type anode layer 2 and the contact end (ballast resistor region) is covered with an oxide film 4. An anode electrode 5 is connected to a portion of the p-type anode layer 2 not covered with the oxide film 4. Since the anode electrode 5 juts out more than the p-type anode layer 2, a depletion layer is likely to extend toward the termination region side when a reverse bias is applied due to a field plate effect.

A termination electrode 6 is connected to the p-type diffusion layer 3 in the termination region. This termination electrode 6 promotes an expansion of the depletion layer. However, the anode electrode 5 and termination electrode 6 do not have the same potential, and are electrically coupled via a nitride film 18 having a certain resistance value. An $n^+$-type cathode layer 7 with injected donor impurity therein is provided below the $n^-$-type drift layer 1. A cathode electrode 8 is connected to the $n^+$-type cathode layer 7.

Figure 2:
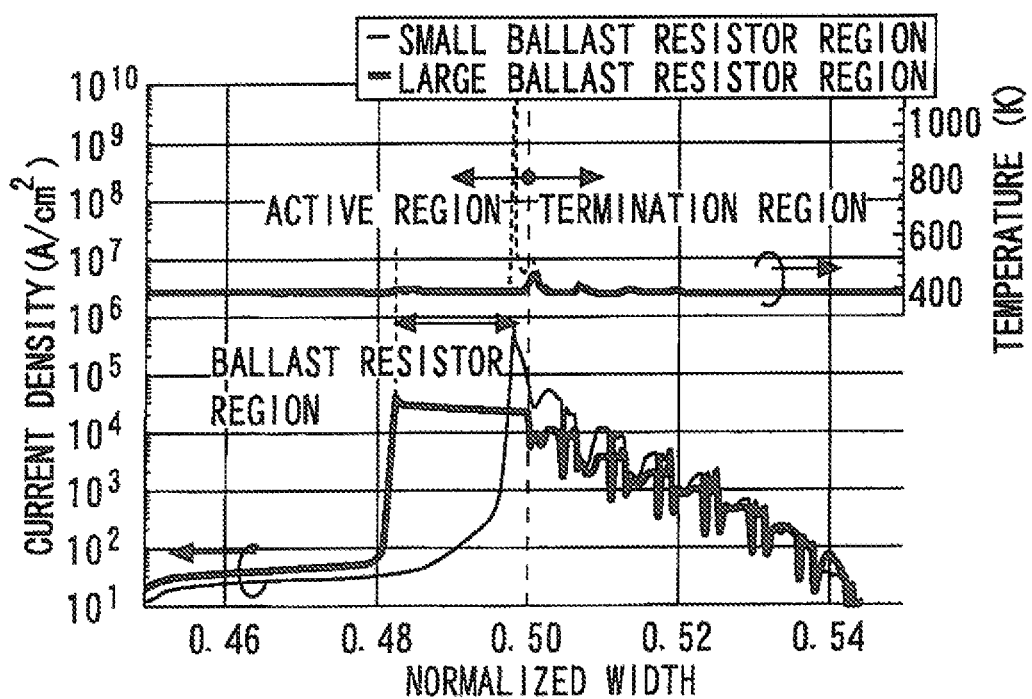
FIG. 2 shows a comparison in a current density distribution and a temperature distribution near the ballast resistor region between two structures differing in magnitude of the ballast resistor region according to Embodiment 1.

FIG. 2 shows a comparison in a current density distribution and a temperature distribution near the ballast resistor region between two structures differing in magnitude of the ballast resistor region according to Embodiment 1. When the ballast resistor region is small, a current concentrates over a narrow range and temperature rises in a localized manner. On the other hand, when the ballast resistor region is large, power is consumed in the ballast resistor region and the current density is thereby dispersed, causing a maximum temperature to drop. Therefore, the overload tolerance with respect to a thermal destruction mode improves.

Figure 3:
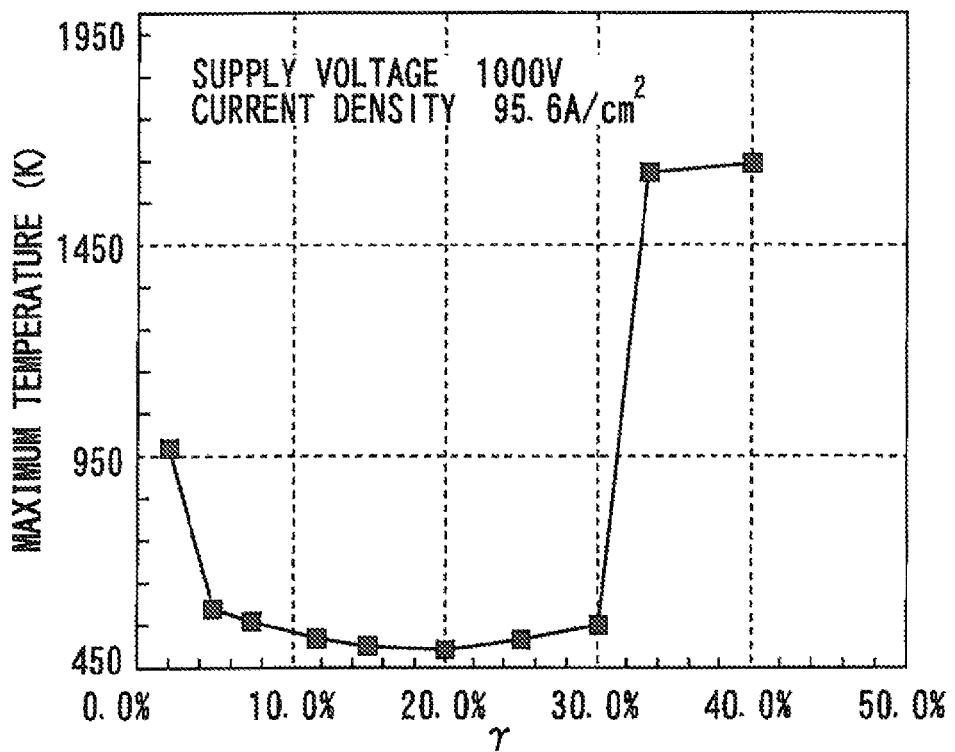
FIG. 3 is a diagram illustrating results of simulating a relationship between a maximum temperature and $\gamma$ in a device in a recovery operation according to Embodiment 1.

FIG. 3 is a diagram illustrating results of simulating a relationship between a maximum temperature and γ in a device in a recovery operation according to Embodiment 1. γ is a value obtained by dividing the area of the ballast resistor region by the area (effective area) of the entire p-type anode layer 2. γ has an optimum range and, the maximum temperature increases outside the range, that is, the overload tolerance deteriorates. When γ is less than 5%, the temperature dispersion effect by the ballast resistor region is small, and so the temperature increases. On the other hand, when γ is greater than 30%, the effective area decreases, which produces a temperature rise caused by a current density increase in the active region. This optimum range varies depending on the cathode structure or operation current density, but if γ is set to 5 to 30%, there will be no problem.

Therefore, the present embodiment assumes that the area of the portion of the p-type anode layer 2 covered with the oxide film 4 is 5 to 30% of the total area of the p-type anode layer 2. This makes it possible to improve the breakdown voltage during a recovery operation or a reverse bias operation of an IGBT.

Figure 4:
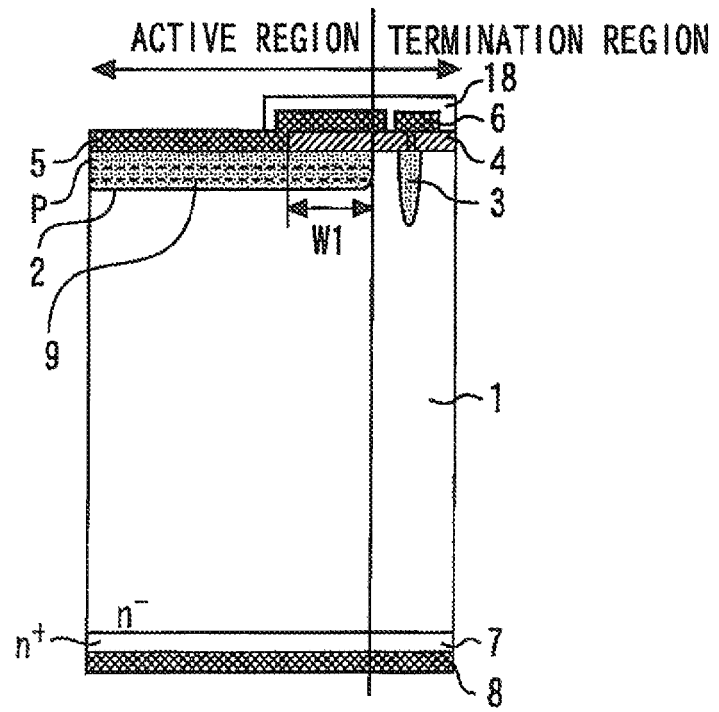
FIG. 4 is a cross-sectional view illustrating modification 1 of the diode according to Embodiment 1 of the present invention.

FIG. 4 is a cross-sectional view illustrating modification 1 of the diode according to Embodiment 1 of the present invention. Impurity concentration of the p-type anode layer 2 has a peak at a predetermined depth. Therefore, it is possible to separate the portion having the smallest resistance from the contact end to inside the substrate. Therefore, carriers gathered from the termination region do not concentrate at the contact end, but preferentially flow through a portion 9 having peak concentration and reach the anode electrode 5. As a result, the current is dispersed and the overload tolerance improves.

Figure 5:
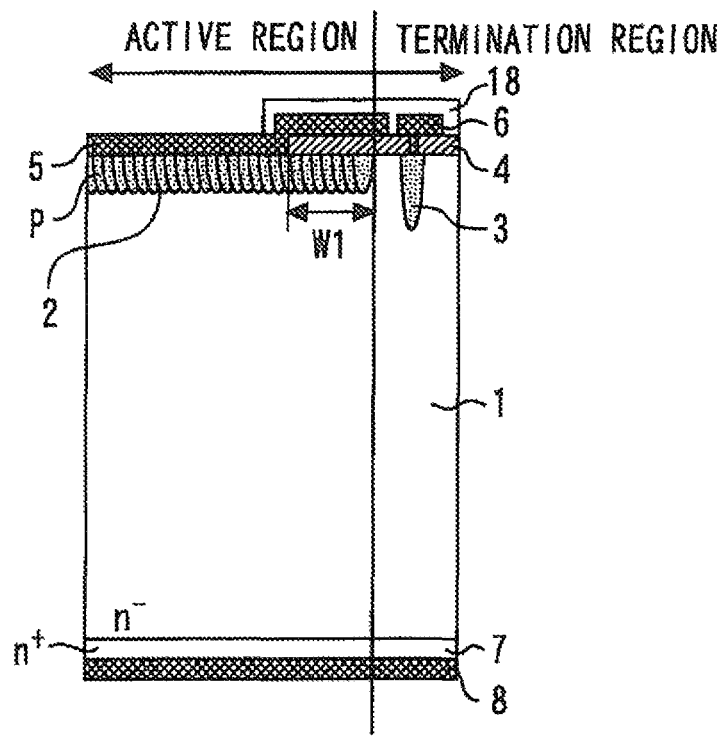
FIG. 5 is a cross-sectional view illustrating modification 2 of the diode according to Embodiment 1 of the present invention.

FIG. 5 is a cross-sectional view illustrating modification 2 of the diode according to Embodiment 1 of the present invention. To minimize the impurity concentration of the p-type anode layer 2, the p-type anode layer 2 is formed by forming an injection window and partially injecting impurity instead of injecting impurity over the entire region.

Figure 6:
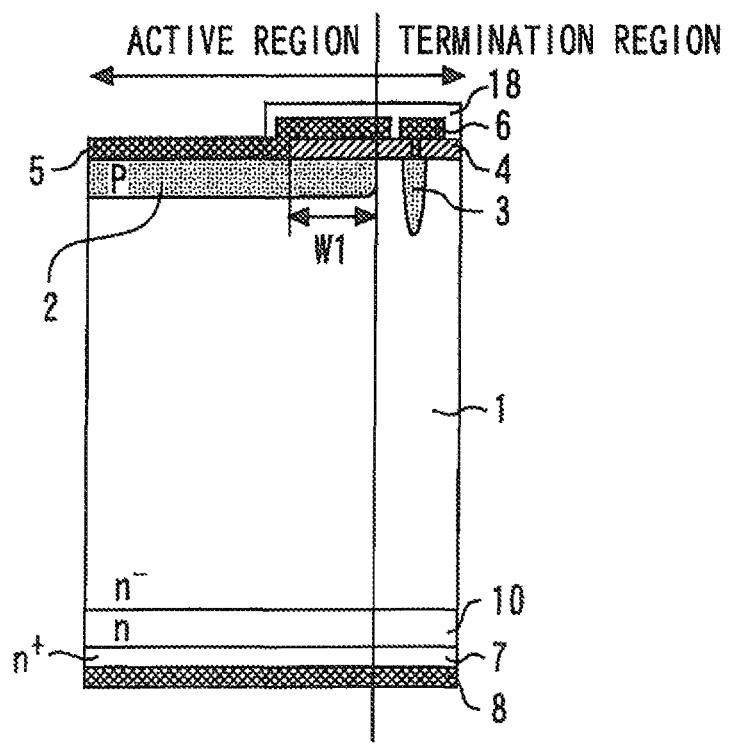
FIG. 6 is a cross-sectional view illustrating modification 3 of the diode according to Embodiment 1 of the present invention.

FIG. 6 is a cross-sectional view illustrating modification 3 of the diode according to Embodiment 1 of the present invention. An n-type buffer layer 10 having lower concentration than the $n^+$-type cathode layer 7 is provided between the $n^-$-type drift layer 1 and $n^+$-type cathode layer 7 in order to prevent a punch-through with respect to the anode.

Figure 7:
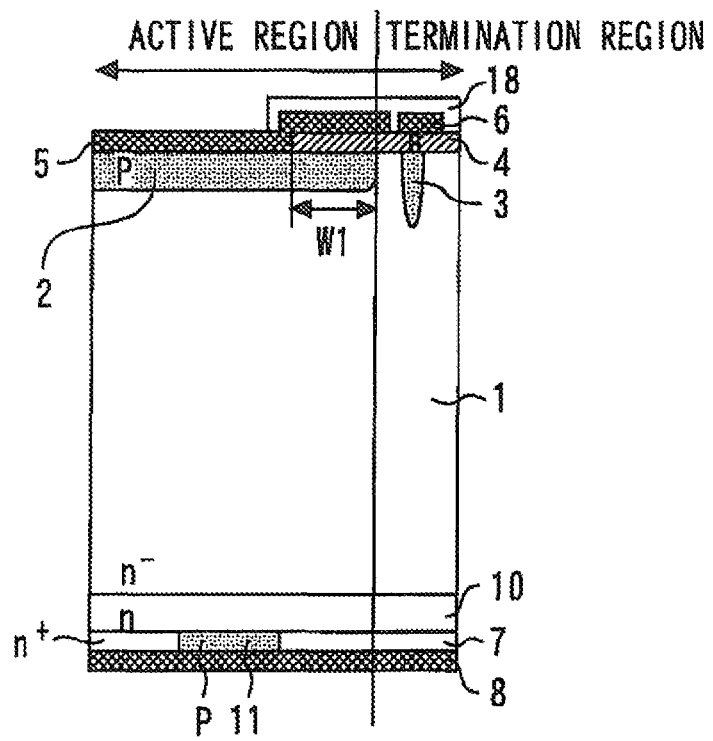
FIG. 7 is a cross-sectional view illustrating modification 4 of the diode according to Embodiment 1 of the present invention.

FIG. 7 is a cross-sectional view illustrating modification 4 of the diode according to Embodiment 1 of the present invention. In the active region, part of the $n^+$-type cathode layer 7 is substituted by a p-type cathode layer 11.

Figure 8:
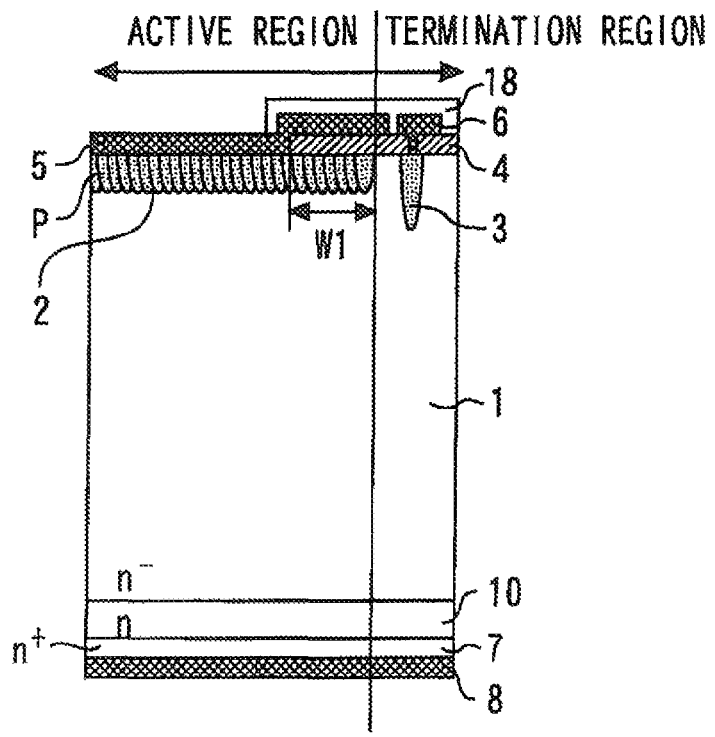
FIG. 8 is a cross-sectional view illustrating modification 5 of the diode according to Embodiment 1 of the present invention.
Figure 9:
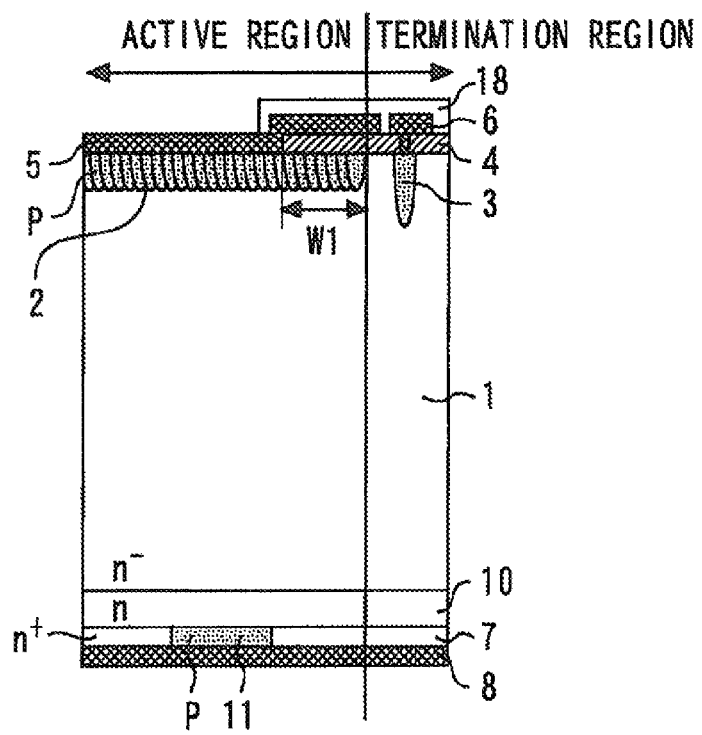
FIG. 9 is a cross-sectional view illustrating modification 6 of the diode according to Embodiment 1 of the present invention.

FIG. 8 is a cross-sectional view illustrating modification 5 of the diode according to Embodiment 1 of the present invention. Modification 5 is a combination of modifications 2 and 3. FIG. 9 is a cross-sectional view illustrating modification 6 of the diode according to Embodiment 1 of the present invention. Modification 6 is a combination of modifications 2 and 4.

Figure 10:
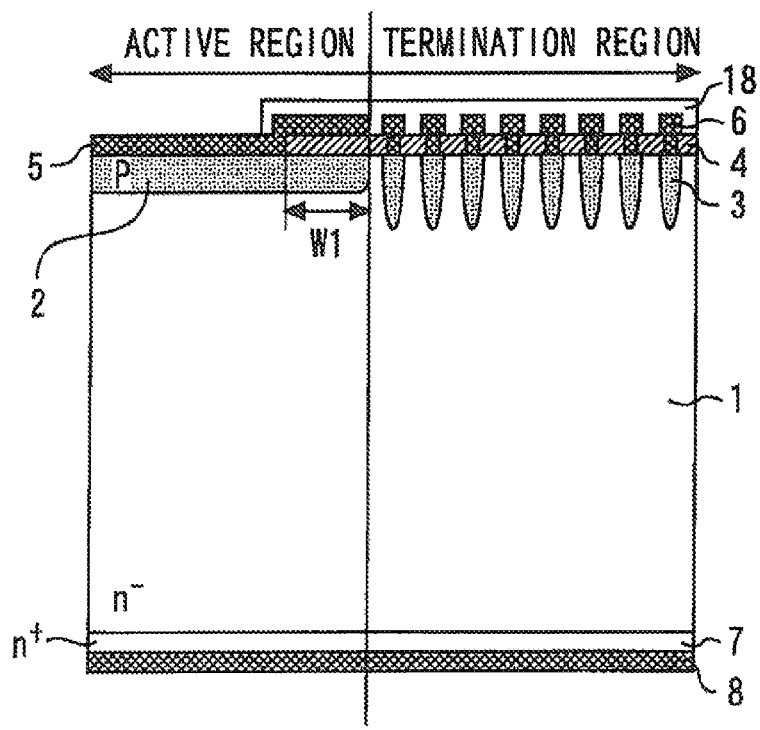
FIG. 10 is a cross-sectional view illustrating modification 7 of the diode according to Embodiment 1 of the present invention.

FIG. 10 is a cross-sectional view illustrating modification 7 of the diode according to Embodiment 1 of the present invention. The diode has an FLR (Field Limiting Rings) structure in which a plurality of p-type diffusion layers 3 and termination electrodes 6 are provided in a ring shape in the termination region.

Figure 11:
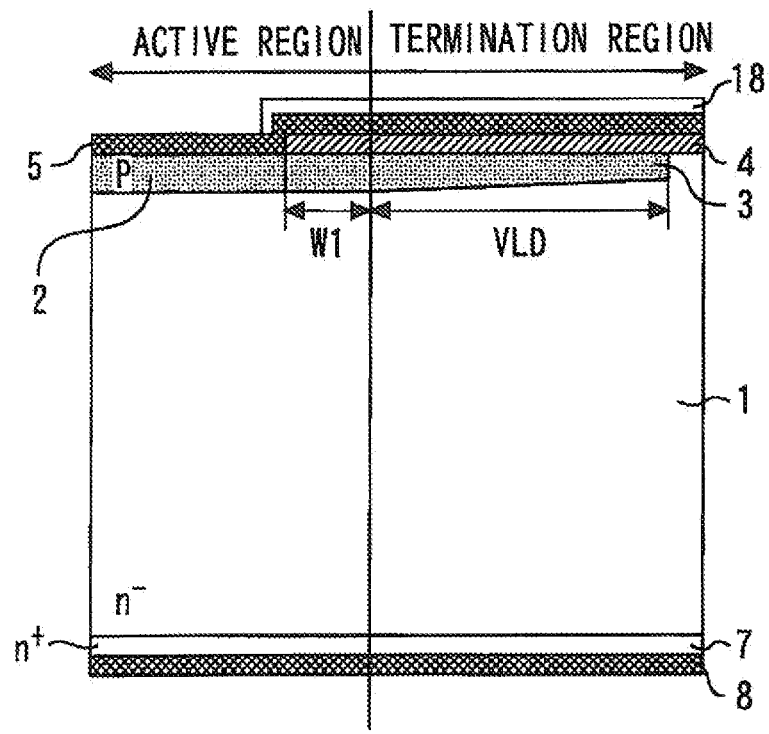
FIG. 11 is a cross-sectional view illustrating modification 8 of the diode according to Embodiment 1 of the present invention.
Figure 12:
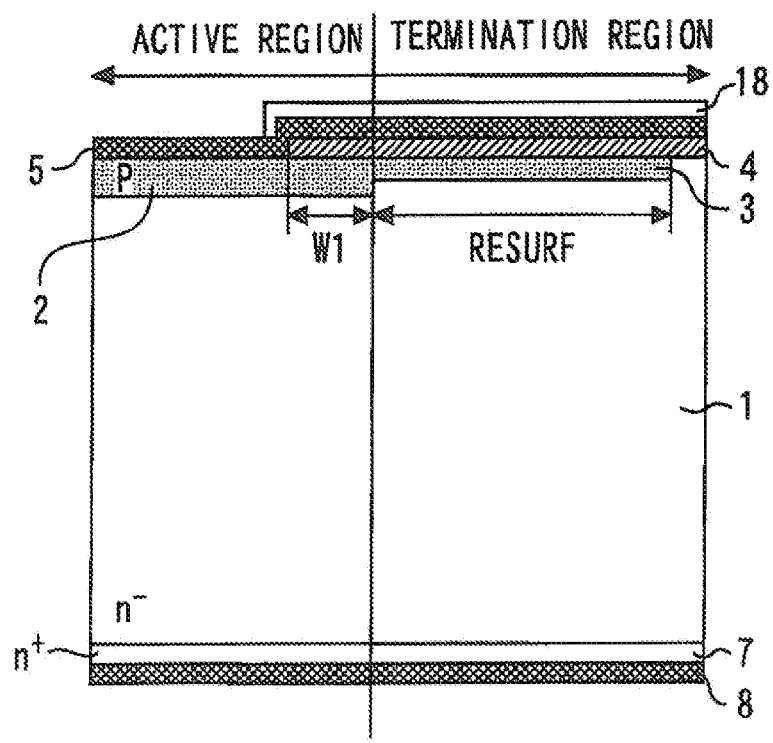
FIG. 12 is a cross-sectional view illustrating modification 9 of the diode according to Embodiment 1 of the present invention.

FIG. 11 is a cross-sectional view illustrating modification 8 of the diode according to Embodiment 1 of the present invention. The p-type diffusion layer 3 in the termination region is formed by VLD (Variable Lateral Doping). FIG. 12 is a cross-sectional view illustrating modification 9 of the diode according to Embodiment 1 of the present invention. The p-type diffusion layer 3 in the termination region has a RESURF (REduce SURface Field) structure.

Figure 13:
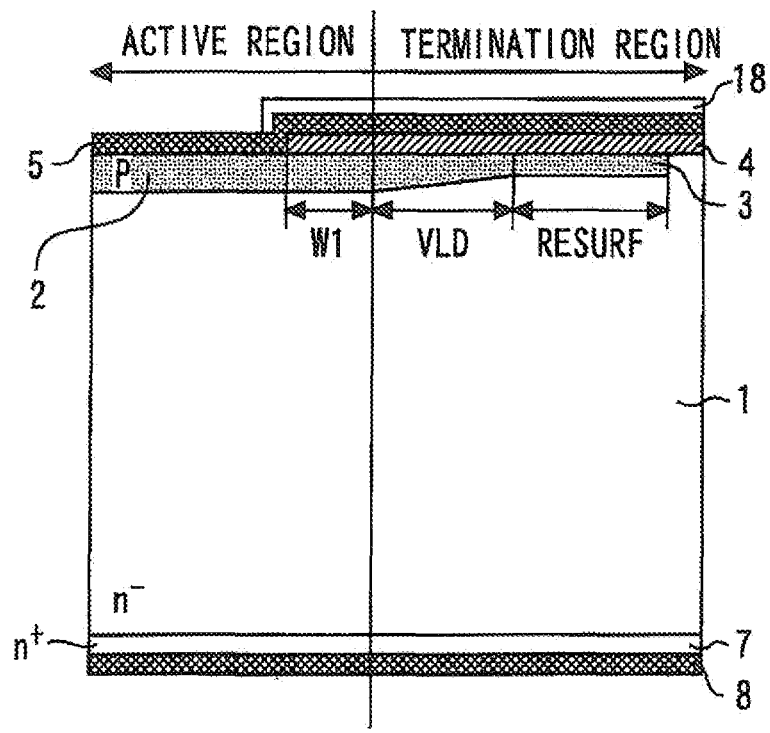
FIG. 13 is a cross-sectional view illustrating modification 10 of the diode according to Embodiment 1 of the present invention.

FIG. 13 is a cross-sectional view illustrating modification 10 of the diode according to Embodiment 1 of the present invention. Part of the p-type diffusion layer 3 in the termination region is formed by VLD and the remaining part has a RESURF structure. These modifications can also achieve effects of the present embodiment.

Embodiment 2

Figure 14:
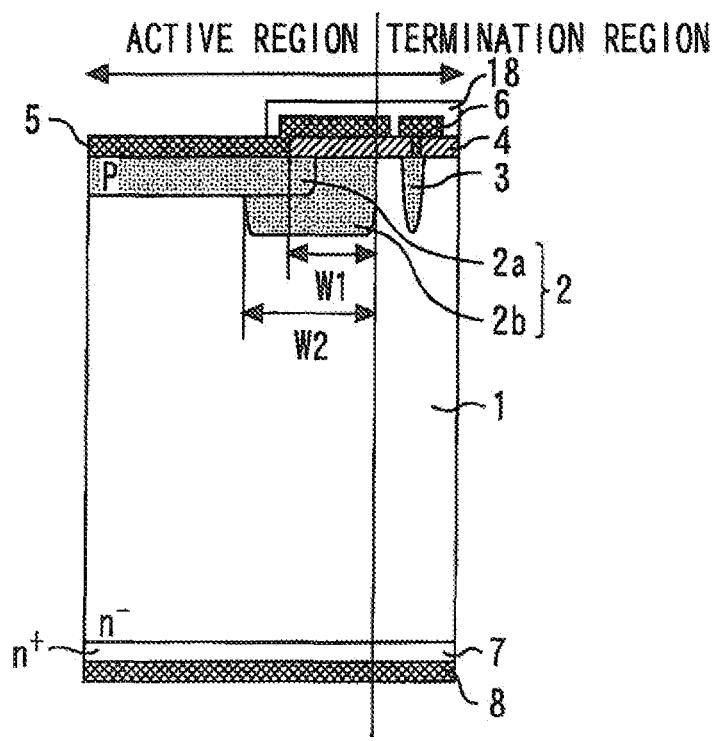
FIG. 14 is a cross-sectional view illustrating a diode according to Embodiment 2 of the present invention.

FIG. 14 is a cross-sectional view illustrating a diode according to Embodiment 2 of the present invention. The p-type anode layer 2 includes a first region 2a and a second region 2b which is provided around the periphery of the first region 2a, deeper than the first region 2a and has higher impurity concentration.

When a width W2 of the second region 2b is smaller than a width W1 of a portion of the p-type anode layer 2 covered with the oxide film 4 (ballast resistor region), the shallow first region 2a having lower impurity concentration is arranged at a contact end. In a recovery operation, since an electric field extends from the main junction, the electric field in the main junction part becomes largest. Moreover, since carriers are also gathered at the contact end from the termination region, the electric field is likely to increase. For this reason, if the first region 2a is arranged at the contact end, avalanche is more likely to occur and the overload tolerance deteriorates.

Thus, the present embodiment adopts the width W2 of the second region 2b greater than the width W1 of the ballast resistor region. This causes the deeper second region 2b having higher impurity concentration to be arranged at the contact end, and the overload tolerance thereby improves. Of course, adapting the whole p-type anode layer 2 so as to have a greater depth and higher impurity concentration may also achieve similar effects.

Figure 15:
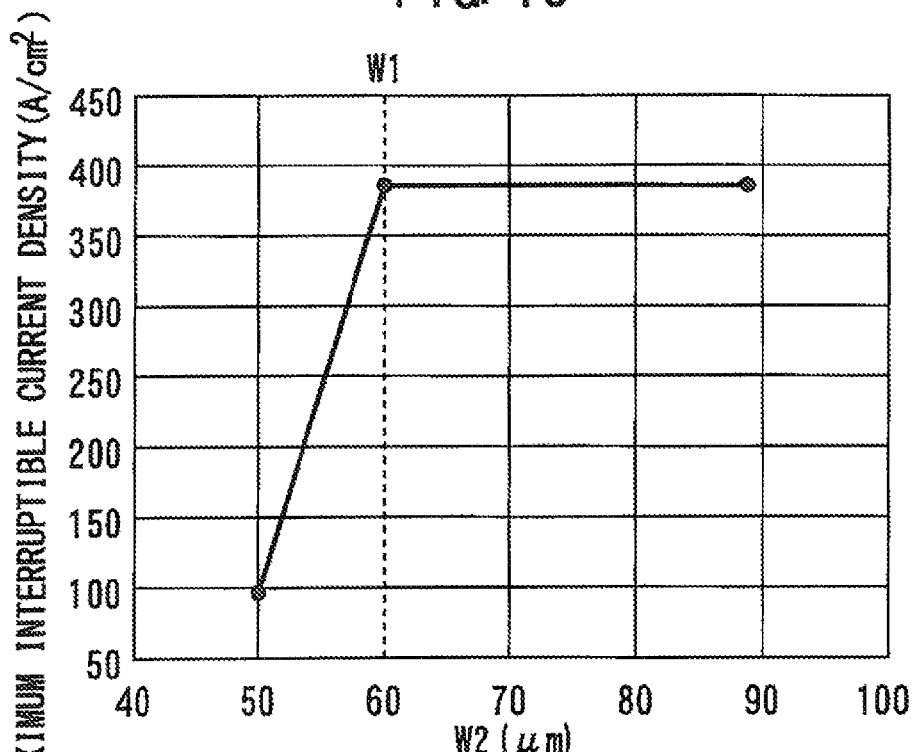
FIG. 15 is a diagram illustrating a relationship between a maximum interruptible current density and W2.

FIG. 15 is a diagram illustrating a relationship between a maximum interruptible current density and W2. W1 is 60 μm. If W2 is greater than 60 μm, it is evident that the maximum current density improves. Therefore, making W2 greater than W1 like the present embodiment improves the breakdown voltage.

Figure 16:
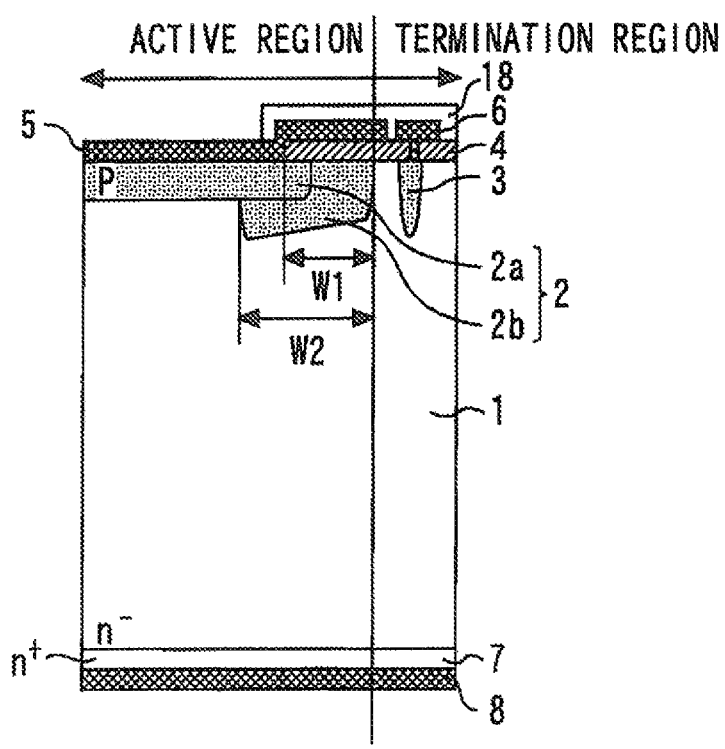
FIG. 16 is a cross-sectional view illustrating modification 1 of the diode according to Embodiment 2 of the present invention.

FIG. 16 is a cross-sectional view illustrating modification 1 of the diode according to Embodiment 2 of the present invention. The second region 2b is formed by VLD (Variable Lateral Doping) so that impurity concentration becomes thinner toward the outside of the chip. This reduces the curvature of the outer edge of the p-type anode layer 2 and thereby reduces the electric field. As a result, avalanche is less likely to occur compared to the p-type anode layer 2 whose concentration in the lateral direction is uniform and the breakdown voltage improves.

Figure 17:
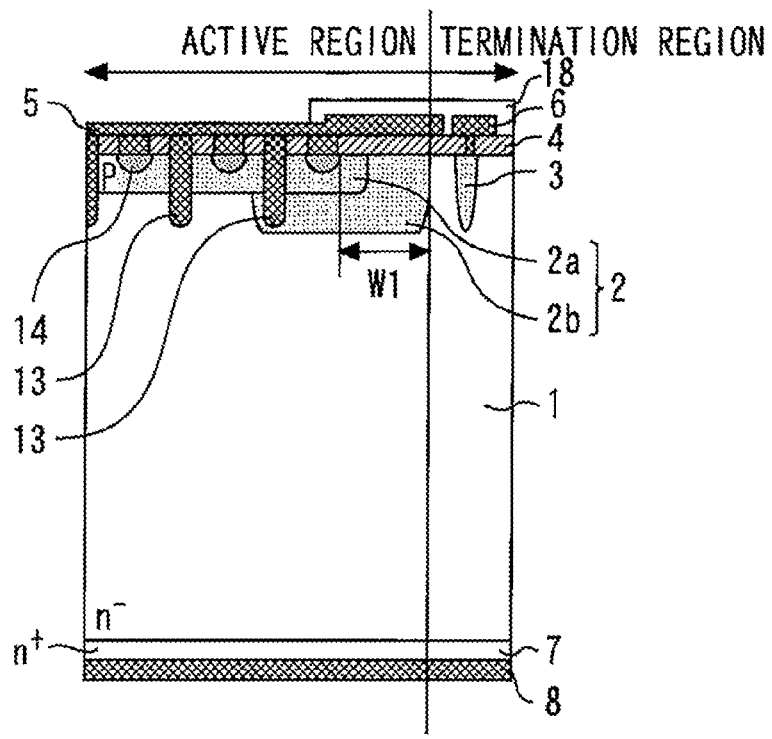
FIG. 17 is a cross-sectional view illustrating modification 2 of the diode according to Embodiment 2 of the present invention.

FIG. 17 is a cross-sectional view illustrating modification 2 of the diode according to Embodiment 2 of the present invention. The p-type anode layer 2 is provided with a plurality of trenches 13. A $p^+$-type anode layer 14 is provided on the p-type anode layer 2 and the $p^+$-type anode layer 14 and the anode electrode 5 are connected together. Similar effects can be achieved in this case as well. However, the outermost trench 13 needs to be covered with the deeper second region 2b to prevent an electric field from concentrating on the corner thereof and from destroying the outermost trench 13.

Embodiment 3

Figure 18:
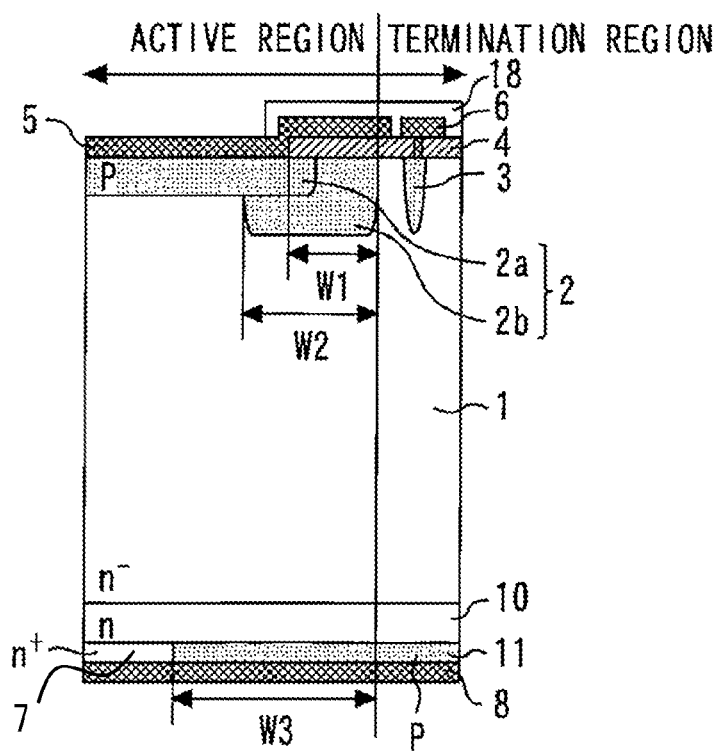
FIG. 18 is a cross-sectional view illustrating a diode according to Embodiment 3 of the present invention.

FIG. 18 is a cross-sectional view illustrating a diode according to Embodiment 3 of the present invention. In the termination region, a p-type cathode layer 11 is provided below the $n^-$-type drift layer 1 and n-type buffer layer 10, and the $n^+$-type cathode layer 7 is provided in the active region. However, the p-type cathode layer 11 extends from the termination region to the active region more inside the chip than the oxide film 4. A width of the p-type cathode layer 11 jutting out over the active region from the outer end of the p-type anode layer 2 as a starting point is defined as W3.

Figure 19:
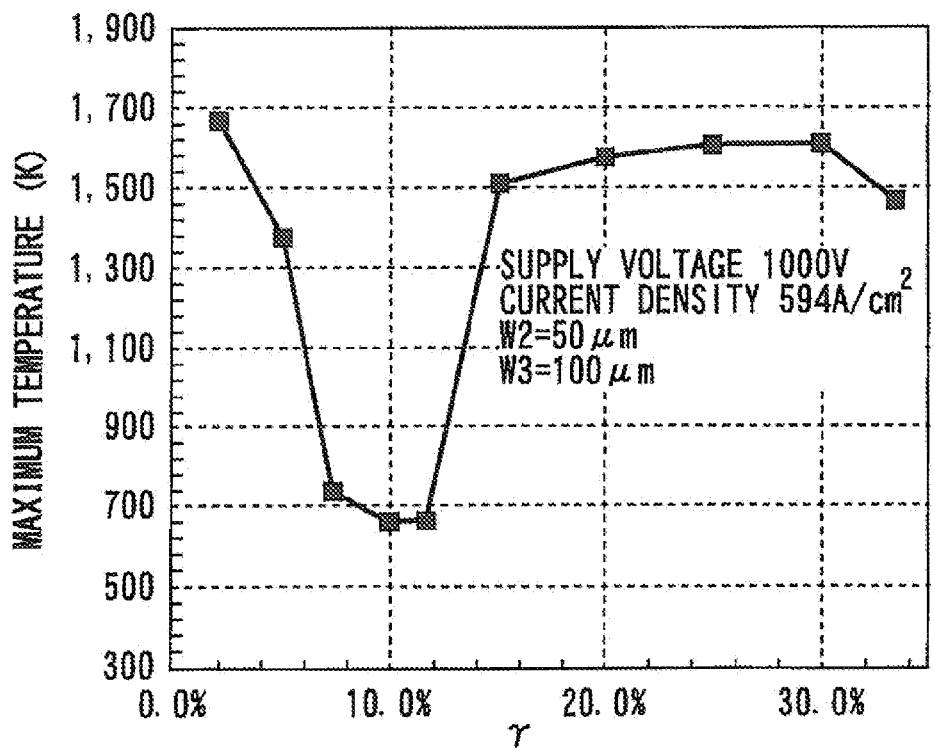
FIG. 19 is a diagram illustrating results of simulating a relationship between a maximum temperature and γ in the device according to Embodiment 3.

FIG. 19 is a diagram illustrating results of simulating a relationship between a maximum temperature and γ in the device according to Embodiment 3. W3 is 100 μm. When γ is small, the temperature dispersion effect by the ballast resistor region is small and so the temperature rises as in the case of Embodiment 1. On the other hand, the temperature rising mechanism when γ is high is different from that in Embodiment 1.

Provision of the p-type cathode layer 11 in the termination region prevents the termination region from operating during an ON time, and therefore the quantity of carriers that concentrate at the contact end from the termination region during a recovery operation reduces and the recovery overload tolerance improves. The $n^+$-type cathode layer 7 in the active region is a region into which carriers are injected during the ON time and becomes a path through which a current flows even during the recovery operation. When the n$^+$-type cathode layer 7 is located at the contact end at which carriers are likely to concentrate during the recovery operation causing avalanche, a current path is formed, and carriers are concentrated, which may cause the temperature to rise and lead to destruction.

Figure 20:
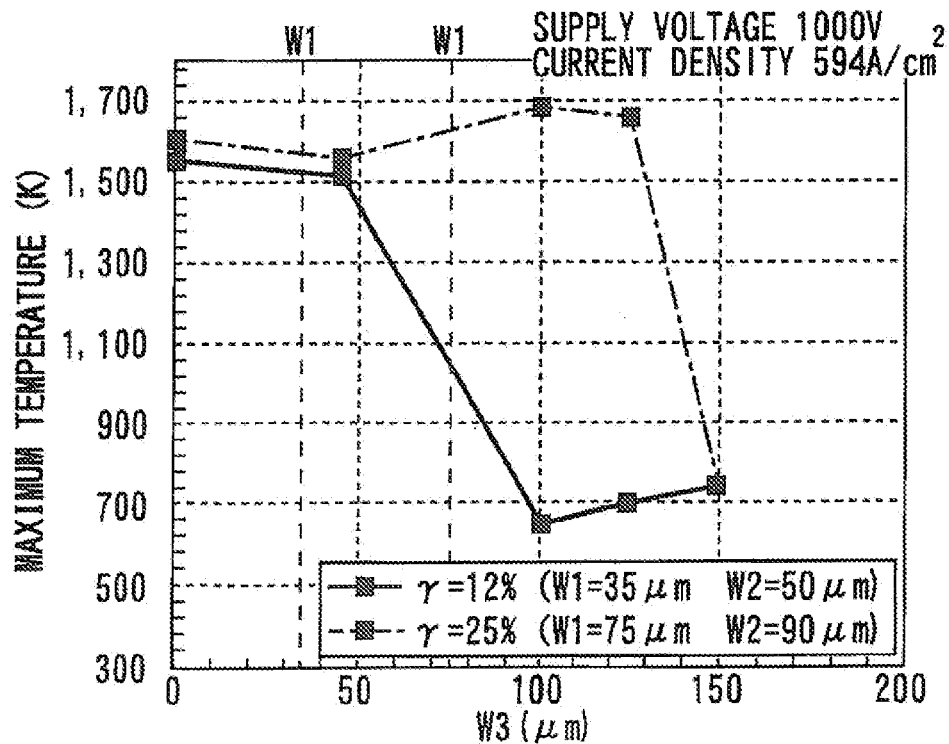
FIG. 20 is a diagram illustrating results of simulating a relationship between a maximum temperature and W3 in the device according to Embodiment 3.

FIG. 20 is a diagram illustrating results of simulating a relationship between a maximum temperature and W3 in the device according to Embodiment 3. It is evident that setting W3>W1 for any W1 causes the maximum temperature to decrease and causes the overload tolerance to improve.

Figure 21:
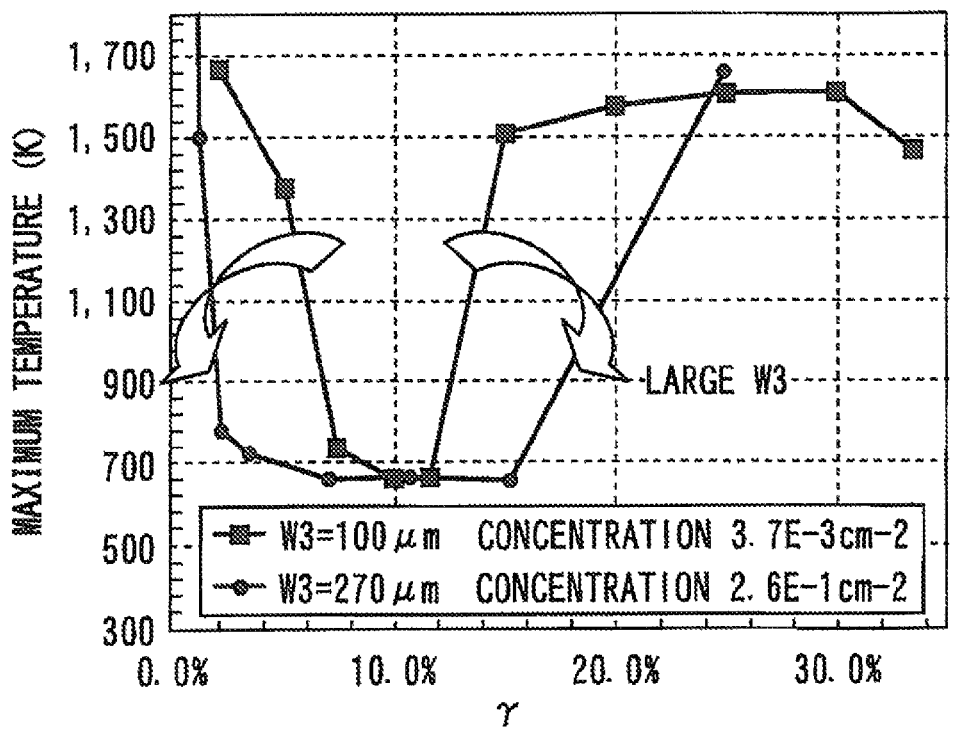
FIG. 21 is a diagram illustrating results of simulating a relationship between the maximum temperature and γ in the device when W3 is changed in Embodiment 3.

From the above-described mechanism, it is also evident that the relationship between γ and the maximum temperature in the device depends on W3. FIG. 21 is a diagram illustrating results of simulating a relationship between the maximum temperature and γ in the device when W3 is changed in Embodiment 3. When W3 is increased, the γ dependency described above becomes less desirable. Increasing W3 causes the number of positive holes injected from the P cathode layer during a recovery operation to increase, and thereby causes recovery loss to increase. Therefore, although W3 is actually designed so as to satisfy a recovery loss desired value of a product, it is necessary to set at least W3>W1.

Embodiment 4

Figure 22:
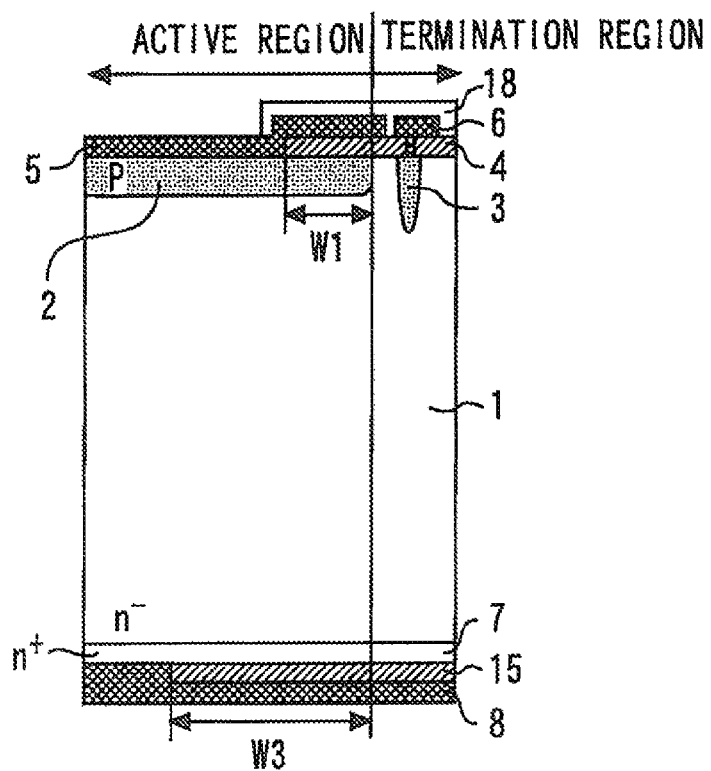
FIG. 22 is a cross-sectional view illustrating a diode according to Embodiment 4 of the present invention.

FIG. 22 is a cross-sectional view illustrating a diode according to Embodiment 4 of the present invention. An oxide film 15 is provided between the n$^+$-type cathode layer 7 and the cathode electrode 8. The oxide film 15 extends from the termination region to more inside the chip than the oxide film 4. Providing a region that does not perform device operation through this oxide film 15 improves the breakdown voltage.

Embodiment 5

Figure 23:
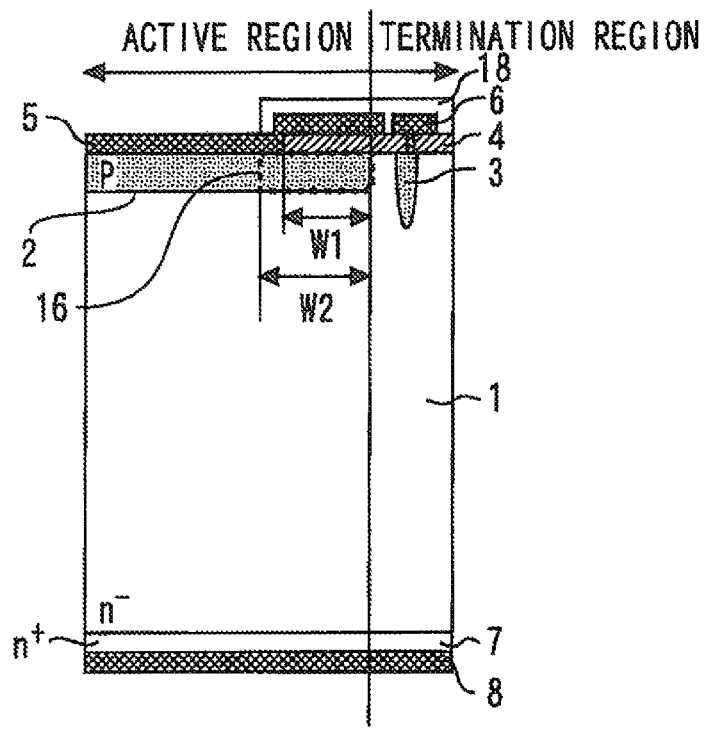
FIG. 23 is a cross-sectional view illustrating a diode according to Embodiment 5 of the present invention.

FIG. 23 is a cross-sectional view illustrating a diode according to Embodiment 5 of the present invention. The diode is provided with a low lifetime region 16 where carrier lifetime is locally reduced in the portion of the p-type anode layer 2 covered with the oxide film 4 and an outer periphery of the portion not covered with the oxide film 4. This causes carriers concentrating at the end of the p-type anode layer 2 to actively vanish and can suppress an increase of electric field strength due to carrier concentration. As a result, avalanche is less likely to occur and the breakdown voltage improves.

Embodiment 6

Figure 24:
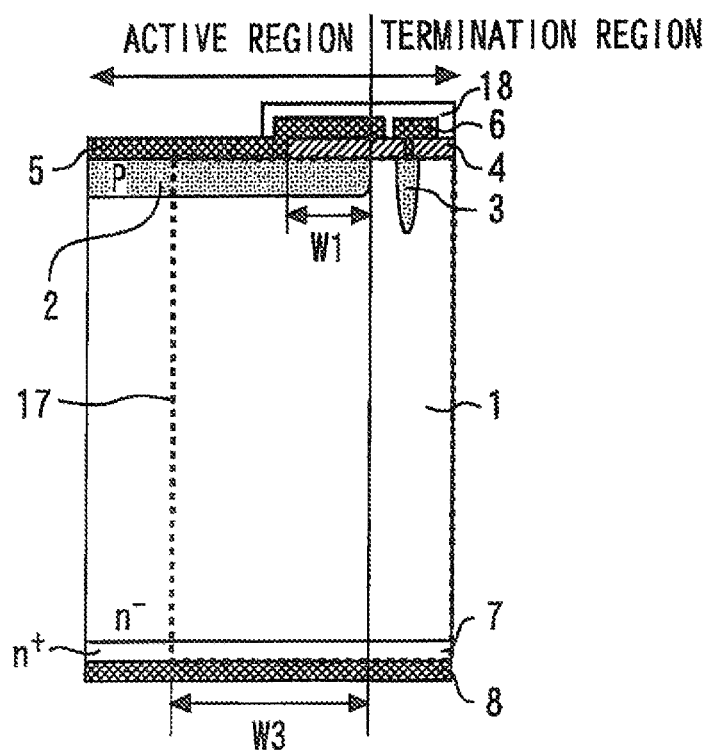
FIG. 24 is a cross-sectional view illustrating a diode according to Embodiment 6 of the present invention.

FIG. 24 is a cross-sectional view illustrating a diode according to Embodiment 6 of the present invention. The diode is provided with a low lifetime region 17 where carrier lifetime is locally reduced in part of the active region and the termination region. The low lifetime region 17 extends from the termination region to more inside the chip than the oxide film 4. Forming the low lifetime region 17 in the termination region and preventing the termination region from substantially performing device operation improve the overload tolerance.

The configurations of Embodiments 1 to 6 may be combined with each other. Moreover, combining the configurations of modifications 1 to 10 of Embodiment 1 in Embodiments 2 to 6 may also achieve similar effects.

DESCRIPTION OF SYMBOLS 1 n-type drift layer
2 p-type anode layer
2a first region
2b second region
3 p-type diffusion layer
4 oxide film (first insulating film)
5 anode electrode
7 n$^+$-type cathode layer
8 cathode electrode
11 p-type cathode layer
15 oxide film (second insulating film)
16,17 low lifetime region

The invention claimed is:
1. A diode comprising:
an n-type drift layer;
a p-type anode layer on the n-type drift layer in an active region;
a p-type diffusion layer on the n-type drift layer in a termination region outside the active region;
a first insulating film covering an outer periphery of the p-type anode layer;
an anode electrode connected to a portion of the p-type anode layer not covered with first insulating film;
an n-type cathode layer below the n-type drift layer; and
a cathode electrode connected to the n-type cathode layer,
wherein an area of a portion of the p-type anode layer covered with the first insulating film is 5 to 30% of a total area of the p-type anode layer,
wherein the p-type anode layer includes a first region and a second region which is provided around a periphery of the first region, the second region having a depth that is deeper than a depth of the first region and the second region having an impurity concentration that is higher than an impurity concentration of the first region,
wherein a width of the second region is larger than a width of a portion of the p-type anode layer covered with the first insulating film,
wherein the depth of the second region decreases toward an outside of a chip,
wherein the second region has a first depth at a first point near one end and a second depth at a second point near another end nearer to the termination region than the one end,
wherein the first depth is greater than the second depth, and
wherein the depth of the second region changes uniformly from the first point to the second point.
2. The diode according to claim 1, further comprising a p-type cathode layer below the n-type drift layer in part of the active region and the termination region,
wherein the p-type cathode layer extends from the termination region farther inside a chip than the first insulating film.
3. The diode according to claim 1, further comprising a second insulating film between the n-type cathode layer and the cathode electrode,
wherein the second insulating film extends from the termination region farther inside a chip than the first insulating film.
4. The diode according to claim 1, wherein carrier lifetime is locally reduced in a portion of the p-type anode layer covered with the first insulating film and an outer periphery of a portion of the p-type anode layer not covered with the first insulating film.

5. The diode according to claim 1, wherein a low lifetime region where carrier lifetime is locally reduced is provided in part of the active region and the termination region, and the low lifetime region extends from the termination region farther inside a chip than the first insulating film.

6. The diode according to claim 1, wherein an impurity concentration of the p-type anode layer has a peak at a portion separated from a contact end.

* * * * *